United States Patent
Kishiyama et al.

(10) Patent No.: US 8,963,494 B2
(45) Date of Patent: Feb. 24, 2015

(54) CHARGE RATE OPTIMIZATION

(75) Inventors: Clay Hajime Kishiyama, San Mateo, CA (US); Kurt Russell Kelty, Palo Alto, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 364 days.

(21) Appl. No.: 13/475,396

(22) Filed: May 18, 2012

(65) Prior Publication Data

US 2013/0307475 A1   Nov. 21, 2013

(51) Int. Cl.
*H02J 7/14* (2006.01)
(52) U.S. Cl.
USPC .......................................... 320/109; 320/103
(58) Field of Classification Search
CPC ................................. H02J 7/0027; H02J 7/00
USPC .................................................. 320/103, 109
See application file for complete search history.

(56) References Cited

U.S. PATENT DOCUMENTS

| | | | |
|---|---|---|---|
| 8,629,657 B2 * | 1/2014 | Kishiyama et al. ........... | 320/132 |
| 2008/0203973 A1 | 8/2008 | Gale et al. | |
| 2010/0138092 A1 | 6/2010 | Kohn | |
| 2011/0018679 A1 | 1/2011 | Davis et al. | |
| 2012/0038314 A1 | 2/2012 | Stewart et al. | |

FOREIGN PATENT DOCUMENTS

WO   2012012021 A1   1/2012

OTHER PUBLICATIONS

International Search Report in application PCT/US2013/040659, dated Sep. 20, 2013.

* cited by examiner

*Primary Examiner* — Thuan Do
(74) *Attorney, Agent, or Firm* — J. Richard Soderberg

(57) ABSTRACT

A charging system for a battery pack, including a charging station transferring energy to the battery pack at a maximum fast charge rate in a first operational mode and transferring energy to the battery pack at a slower charge rate in a second operational mode; a data collection system acquiring data indicating a state of charge of the battery pack and one or more desired charge optimization parameters; and a station control, responsive to the data and to the desired charge optimization parameters, automatically establishing a charging profile for the battery pack to assert a control signal and operate the charging station in the second operational mode whenever the charging station is able to transfer sufficient energy to the battery pack at the slower charge rate to meet an SOC target and a charge completion time target.

26 Claims, 2 Drawing Sheets

CHARGE RATE OPTIMIZATION

BACKGROUND OF THE INVENTION

The present invention relates generally to charge rate optimization, and more specifically, but not exclusively, to implementation of a charge rate at less than a maximum fast rate based upon user requirements for optimization of secondary considerations of economy, battery life, or the like when primary considerations of SOC and charge completion time targets are not adversely impacted by a slower charge rate.

Charging high performance battery packs implicate many nuanced considerations and subtleties in order to maximize sometimes competing goals of maximum battery pack lifetime, performance, and availability. For user convenience, fast chargers have been designed and implemented for personal and public charging stations. These chargers are designed to quickly restore a user's access to their electric vehicle. This enhanced charging speed comes at a potential cost of degrading battery life.

For many electric vehicle (EV) users, recharging their EV as quickly as possible is considered very important, and these users select the fastest charging option whenever possible even when a slower charging option may be more economical, more efficient, and/or better for the battery pack. What is needed is a system and method providing fast charge optimization based upon user need.

BRIEF SUMMARY OF THE INVENTION

Disclosed is a system and method providing fast charge optimization based upon user need. Manually or automatically determined or inferred actual user need is used to optimize charging rate when the user does not otherwise require the full charging rate over the entire charging period (the maximum fast charge is always available).

The following summary of the invention is provided to facilitate an understanding of some of technical features related to fast charge optimization, and is not intended to be a full description of the present invention. A full appreciation of the various aspects of the invention can be gained by taking the entire specification, claims, drawings, and abstract as a whole. The present invention is applicable to other charging scenarios in addition public charging of electric.

An electric charging system for an energy storage system includes a charging station electrically coupled to the energy storage system, the charging station transferring charging energy to the energy storage system at a maximum fast charge rate in a first operational mode and transferring charging energy to the energy storage system at a slower charge rate in a second operational mode, the modes responsive to a control signal; a data collection system acquiring a set of data indicating a state of charge (SOC) of the energy storage system and one or more desired charge optimization parameters; and a station control, responsive to the set of data and to the desired charge optimization parameters, automatically establishing a charging profile for the energy storage system to assert the control signal and operate the charging station in the second operational mode whenever the charging station is able to transfer sufficient energy to the energy storage system at the slower charge rate to meet an SOC target and a charge completion time target, otherwise asserting the control signal and operate the charging station in the first operational mode.

A computer-implemented charging method for an energy storage system including a) collecting data to answer an optimization query designed to establish an SOC target and a charge completion time target for the energy storage system, a primary consideration for charging the energy storage system including satisfaction of the SOC target and the charge completion target; b) determining using a microprocessor system whether a satisfaction of the primary consideration requires a maximum fast charge rate from a charging station coupled to the energy storage system; c) charging the energy storage system at the maximum fast charge rate when required to attempt to satisfy the primary consideration; otherwise d) charging the energy storage system at a secondary charge rate slower than the fast charge rate to satisfy the primary consideration when satisfying the primary consideration does not require the maximum fast charge rate, the secondary charge rate responsive to one or more secondary considerations including one or more of an improved economical charging cycle and an improved lifetime for the energy storage system.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Embodiments of the present invention provide a system and method providing fast charge optimization based upon user need. The following description is presented to enable one of ordinary skill in the art to make and use the invention and is provided in the context of a patent application and its requirements.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
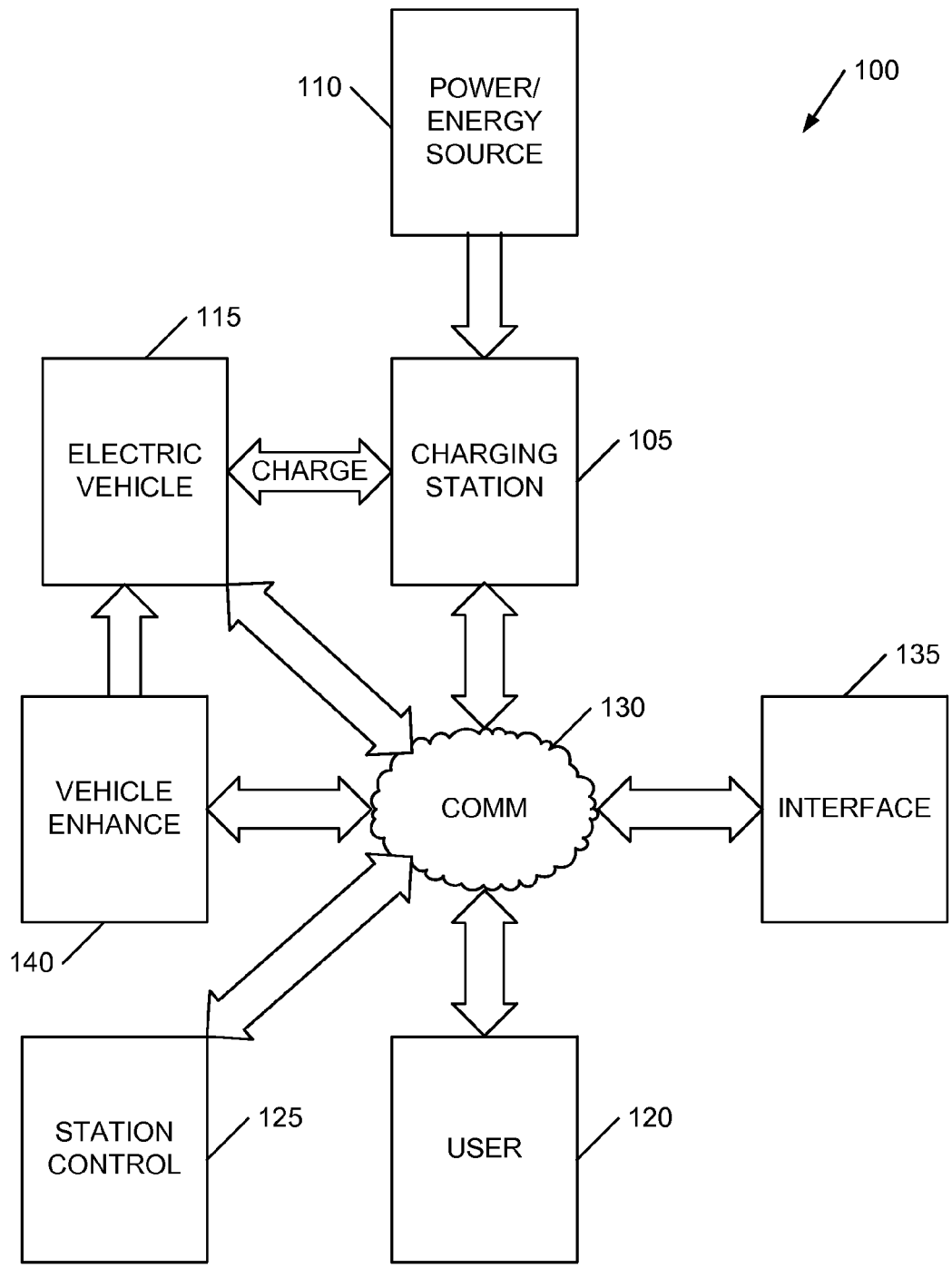
FIG. 1 illustrates an enhanced charging station having user-need optimization features.

FIG. 1 illustrates an enhanced charging system 100 including an optimized fast charging station 105 having user-need optimization features. Fast charging station 105 supplies electrical energy for recharging energy storage systems (e.g., high-performance battery packs used in electric vehicles, plug-in hybrids electric-gasoline vehicles, semi-static and mobile electrical units, and the like). This electrical energy is converted and appropriately processed for desired electrical characteristics from an energy/power source 110 (e.g., electrical grid, network AC line power, battery source, or the like) that sets a maximum charge rate for charging station 105. The present invention is applicable to any charging station 105, whether it uses a constant power, constant current, constant voltage, algorithmic charging curve, or other charging profile providing a range of charge rates and irrespective of the nature of power source 110.

As noted above, charging station 105 may be used for many different systems and provide differing amounts of charging energy, whether it is a level 1, level 2, or level 3 charger, or other configuration not presently implemented, and the present invention may be adapted appropriately. To simplify the discussion and to aid in understanding aspects of the invention, a scenario is described in which charging station 105 includes a level 3 fast charger using electrical grid energy for power source 110 to charge an electric vehicle 115.

Enhanced charging system 100 includes a station control 125 which oversees the charging and implements appropriate optimization profiles based upon actual needs of user 120. A communications network 130 is shown interconnecting selected components of enhanced charging system 100. Communications network 130 may be implemented in a wired mode, a wireless mode, or a combination of wired and wireless modes. There may be multiple different implementations of wired and wireless technologies all employed by enhanced charging system 100, some of which are further explained below. Not all aspects of enhanced charging system 100 will include the same components or provide the same interconnections. Information and data flows between the interconnected selected components is appropriate to the degree and nature of the optimizations desired and implemented.

Enhanced charging system 100 additionally includes a user interface 135 and a generic function referred to herein as vehicle enhancement 140. User interface 135 may be any appropriate input/output system enabling user 120 to either directly enter charge optimization data, a fast charging profile, or other explicit or inferred data from which an optimized charging profile for user 120 may be selected or constructed. User interface 135 may be integrated into and/or distributed over one or more of the other components of enhanced charging system 100. Vehicle enhancement 140 includes features and systems that may be used in the building and implementation of a desired optimization profile.

For example, for some cell chemistries used in the energy storage system of certain high-performance electric vehicles 115, frequent and extended uses of fast charging may adversely impact useful lifetime performance of the energy storage system. For some of these cell chemistries and charging implementations, some vehicle enhancement (e.g., environmental control of a system or component) of electric vehicle 115 will help counter some of the adverse effects of fast charging. One such environmental control is to ensure that the energy storage system is at an optimum temperature before initiation of the optimized charging profile being implemented. In such cases vehicle enhancement 140 includes a temperature control (typically a warmer) for the battery pack serving as the propulsion energy storage system of electric vehicle 115. Other implementations may employ alternative or additional vehicle enhancement systems appropriate for those applications and design considerations.

Station control 125 collects available data from components of enhanced charging system 100 to establish an optimized charging profile that transfers charging energy/power from charging station 105 to electric vehicle 115. This optimized charging profile may be dynamic or static and it may be explicitly set by user 120 (e.g., using user interface 135) or inferred from other available data. For the preferred implementation, the optimized charging profile primarily ensures that user 120 meets their needs for use of electric vehicle 115. Secondarily other considerations may be optimized as long as these primary needs are satisfied.

The primary consideration is set by station control 125 determining when user 120 needs electric vehicle 115 to be available and what is the range requirement for electric vehicle 115 when user 120 expects to use electric vehicle 115. There are many different ways station control 125 may establish or infer answers to these questions, the answers being used to build the charge optimization profile.

Typically, the answer to the optimization question to user 120 of "when do you need it and how far do you need to go?" is "it is needed as soon as possible and I need to go as far as possible." This may be expressed in such general terms or in explicit state of charge (SOC) terms such as 80 miles range in one hour from now. In these cases, charging station 105 provides maximum available fast charge rate to meet the primary need of user 120. However in other cases, the answer to the optimization question is something else and in these instances enhanced charging system 100 offers many advantages without interfering with satisfaction of primary considerations in the typical case.

In some cases, user 120 may not be aware or cognizant that less than a maximum fast charge will satisfy their current optimization question. The user may know that they need to be in City X three hours from now, but not realize that the necessary SOC for that range could be achieved with something other than a maximum fast charge. For situations when a "medium charge rate" scenario produces a valid charging profile that meets the user's primary needs, enhanced charging system 100 is then able to implement the charging profile optimized to include secondary considerations. These secondary considerations may be established by user 120, set by an owner/operator of charging station 105, or some combination. Some representative secondary considerations include a battery life conservation mode, an economical mode, a charger queue status (e.g., whether other customers are waiting to use the charger), a charger status, or other modes. Enabling station control 125 to factor in secondary considerations provides options that would not otherwise be available.

Enhanced charging system 100 is more intelligent and uses available resources more optimally. For example, when user 120 requests (explicitly or implicitly) 80% SOC two hours from the initiation of charging, station control 125 determines, for this particular charging use, an optimal combination of vehicle enhancement (e.g., pre-heating of the battery pack) and lower charge rate to meet the user primary need. This eliminates/minimizes any risk of possible battery life degradation due to this charging cycle. Alternatively, when the secondary consideration is a more economical mode, station control 125 could opt-out of using energy for battery pack pre-heating.

In some scenarios, it is possible that user 120 could be charged based upon some tiered pricing structure for use of high-performance charging (e.g., fee based upon charging measured in miles/minute or kWh/minute or the like). For charging scenarios where user 120 does not require the highest-priced charging rate, automatic use of a lower priced, slower charge rate advantages user 120, particularly for an economical mode secondary consideration. Implementations of the present invention may be adapted for different sets of secondary considerations.

The more data that is available to station control 125, the better enhanced charging system 100 is able to define and implement an appropriate optimization charging profile. Preferably station control 125 takes into account how much charge energy is currently stored in electric vehicle 115 and understands other charging parameters of enhanced charging system 100 to be able to estimate charge times and expected SOC levels accurately in order to meet the primary needs of user 120. This data may be made available from on-vehicle sensors, on-vehicle management systems, or the like.

Station control 125 collects any available necessary or desirable data using communications network 130 to access charging station 105, electric vehicle 115, user 120, and/or user interface 135. Station control 125 may, in some implementations, not only obtain key charging parameters (e.g., current SOC) from electric vehicle 115, but may access onboard or cloud-based electronic trip planning/navigation systems to automatically help establish answers to the optimization question (e.g., how far away is the next stop for user 120 and is there a scheduled time for departure/arrival). Station control 125 has access to the available data to formulate many different questions/responses that explicitly define, or allow intelligent inference of, an optimized charging profile that meets desired primary and selected secondary considerations.

The optimized charging profile may be static, dynamic, or some combination. A static profile is one that is set at the initiation of the charging cycle. It will stop when completed, or it may be interrupted, such as to terminate charging early or to redefine the charging profile. Enhanced charging system 100 enables dynamic charging profiles to be used as well. For example, user 120 may communicate with station control 125 periodically using communications network 130 (e.g., user 120 may employ a portable electronic device (e.g., smartphone or the like) operating a software process that communicates wirelessly with station control 125 and/or electric vehicle 115). Changes to the optimization question (e.g., lunch is running longer than anticipated and more time is available for charging or the destination is changed so less range is required) result in automatic adjustments to the optimization profile when communicated to station control 125, such as by entering updated data from the portable electronic device carried by user 120.

In some cases charging station 105 may be able to provide variable rate charging to multiple electric vehicles at the same time. Charging station 105 would be able to dynamically allocate different charging rates to different electric vehicles based upon an aggregation of priority and optimization questions of several users at one time. In some cases charging station 105 would not be able to provide all users with full fast charging at the same time and enhanced charging system 100 would dynamically apportion charging energy transfer rates among the several electric vehicles.

Enhanced charging system 100 offers additional options to the users of the several electric vehicles and to the owner/operator of charging station 105. A simple priority system would have a first electric vehicle (vehicle A) arriving at charging station 105 first receive priority over a second electric vehicle (vehicle B) arriving later. However based upon optimization questions, it may be that vehicle B has need of a full fast charge and vehicle A could use a medium charge and still meet desired SOC and departure targets for both users. Enhanced charging system 100 is able to reallocate resources of charging station 105 to meet both user needs.

There are other options as well. In the case that all needs of all concurrent users of charging station 105 cannot be met, station control 125 may issue offers to first-in-time higher priority users requesting changes to their travel plans (e.g., delay departure by some predetermined time) in exchange for appropriate compensation. Station control 125 is able to intelligently make offers as it understands all current charging expectations and scheduled charge completion times. For example, user A may be offered a discount on her charging costs if she agrees to delay her departure 15 minutes to accommodate user B's need for a maximum fast charge. Said vehicle enhancement system may be disabled when said cost optimization option is active. When agreed to, the users are notified of the new charging schedules, with both users satisfied of the outcome. In some implementations, concurrent users of charging station 105 may participate in a real-time auction for charging rate in cases where demand exceeds capacity. Thus enhanced charging system 100 may establish a dynamic price for different tiers of charging speed to accommodate users with urgent needs.

In some cases, it may meet overall optimization goals for charging station 105 to consider that a newer arrival may already have the battery pack at or near an optimum temperature for charging. Giving this user charging priority may help meet other implemented secondary considerations of enhanced charging system 100. This may be advantageous as an earlier user's requirement for a pre-heating phase is not affected by delaying initiation of charging and thus will consume the same amount of energy for warming and charging irrespective of whether charging is performed "now" as opposed to "later." As long as the user's primary needs are otherwise met, changing charging order or priority does not adversely impact the earlier user. In this scenario the overall energy used is less when considering energy consumption of both drivers than would be the case of charging performed based strictly on arrival order.

Figure 2:
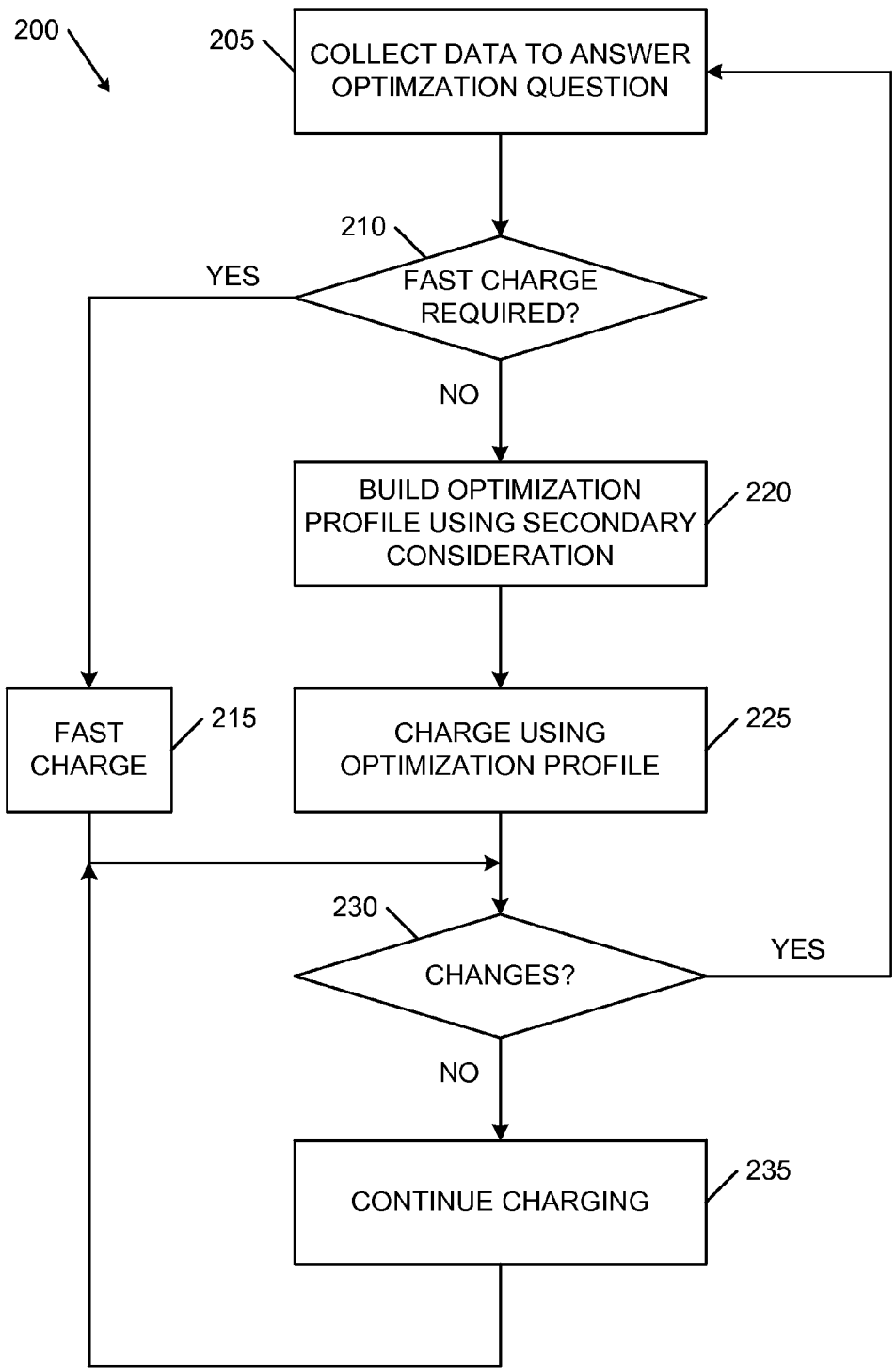
FIG. 2 illustrates a flowchart for an enhanced charging process.

FIG. 2 illustrates a flowchart for an enhanced charging process 200, such as may be implemented by enhanced charging system 100 shown in FIG. 1. Process 200 includes steps 205-235 and begins at step 205 to collect data to answer some version of the optimization question to the user: "When do you need your electric vehicle to be ready and how far do you need to go?" Process 200 receives data from the electric vehicle and/or the user to explicitly answer this question, or may infer the answer from other available data, and sets this as the primary consideration. Based upon the collected data, process 200 next at step 210 establishes an answer to a first question of whether a maximum/fast charge is required to best meet the primary consideration. When the answer to that question is "YES" process 200 branches to step 215 to initiate the required fast charge. When the answer to the question of step 210 is "NO" then process 200 branches to step 220 to build an optimization profile that includes one or more secondary considerations. These secondary considerations may include an "economical" mode or a "best battery life" mode, a combination of these modes or some mode altogether different. The mode may be set or influenced by the user or owner/operator of the charging station. After the optimization profile is built at step 220, process 200 advances to step 225 to initiate charging using the optimization profile which is likely to be, but not necessarily, different from the maximum fast charge of step 215.

After both step 215 and step 225, process 200 makes a second test at step 230 to determine whether there have been any changes that could affect the charging rate currently being applied (i.e., a change to the primary or secondary considerations used by process 200). These changes may be explicit changes or may be implicit in other factors affecting enhanced charging system 100. Explicit changes include an express change to departure time or destination that is communicated to station control 125. Implicit changes include secondary factors that implicate changes to the departure time or destination, affect charge rate, and/or affect vehicle enhancement. For example, before charging is actually initiated using an existing optimization profile, temperature data currently indicates that there are now benefits to pre-heating the energy storage system when there had been no previous advantage to pre-heating during a previous test (e.g., the energy storage system has cooled). When there are no changes at step 230, process 200 implements step 235 and continues charging as determined by step 215 or step 225.

Process 200 continues to loop from step 235 to the test at step 230 while charging in case important changes are made or detected.

When the test at step 230 indicates that there are changes that could affect the answer to the optimization question, process 200 returns to step 205 to collect new data as necessary or appropriate. Process 200 continues until charging is terminated.

The system and methods above has been described in general terms as an aid to understanding details of preferred embodiments of the present invention. In the description herein, numerous specific details are provided, such as examples of components and/or methods, to provide a thorough understanding of embodiments of the present invention. It is anticipated that many implementations of the present invention include fast level 3 chargers for electric vehicles, such as incorporated into public charging stations. The present invention may be implemented in other contexts as well. One of the many advantages of the disclosed implementations of the present invention is that the user is not always tasked with understanding the many nuances and most current subtleties in implementing effective charging profiles to meet secondary considerations. As noted, there are nuances to building and implementing an effective charging profile to optimally enhancing battery life for any particular energy storage system. By using the systems and methods disclosed herein, the user does not need to learn and understand these evolving nuances. The user may be goal focused, and the systems and methods may optimally implement the charging profile(s) that best meet those goals. As the nuances evolve, the systems and methods are easily upgraded to implement the appropriate requirements, all without detailed involvement from the users. One or more components of the system and method are implemented using microprocessors executing instructions accessed from memory, these instructions available in software or firmware.

Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. An electric charging system for an energy storage system, comprising:

a charging station electrically coupled to the energy storage system, said charging station transferring charging energy to the energy storage system at a maximum fast charge rate in a first operational mode and transferring charging energy to the energy storage system at a slower charge rate in a second operational mode, said modes responsive to a control signal;

a data collection system acquiring a set of data indicating a state of charge (SOC) of the energy storage system and one or more desired charge optimization parameters; and a station control, responsive to said set of data and to said desired charge optimization parameters, automatically establishing a first charging profile for the energy storage system, with said first charging profile asserting said control signal and operating said charging station in said second operational mode whenever said charging station is able to transfer sufficient energy to the energy storage system at said slower charge rate to meet a charge target, said first charging profile asserting said control signal to operate said charging station in said first operational mode whenever said charging station is unable to transfer sufficient energy to the energy storage system at said slower charge rate to meet said charge target.

2. The electric charging system of claim 1 wherein the energy storage system provides propulsion energy for an electric propulsion motor of a vehicle and wherein said charge target includes a particular driving range and a particular charge completion time target.

3. The electric charging system of claim 1 wherein a plurality of different charging profiles are each capable of meeting said charge target during a charging session wherein said station control selects a particular one charging profile from said plurality of charging profiles based upon an optimization goal.

4. The electric charging system of claim 3 wherein said optimization goal includes a cost minimization option that minimizes a cost for transferring energy to meet said charge target during said charging session.

5. The electric charging system of claim 4 further comprising a vehicle enhancement system that improves a charging-related parameter of the energy storage system when implemented, said vehicle enhancement system incompatible with providing a desired SOC level for the energy storage system in a shortest period, wherein said station control inhibits an actuation of said vehicle enhancement system in said first operational mode and enables said actuation of said vehicle enhancement system in said second operational mode.

6. The electric charging system of claim 5 wherein said vehicle enhancement system includes a heater, said charging-related parameter includes battery life, and said actuation pre-heats the energy storage system to a desired temperature before initiation of energy transfer at said slower charge rate.

7. The electric charging system of claim 6 wherein said vehicle enhancement system is disabled when said cost optimization option is active.

8. The electric charging system of claim 3 wherein said optimization goal minimizes a battery life degradation responsive to transferring energy to meet said charge target during said charging session.

9. The electric charging system of claim 1 wherein said first charging profile includes switching between said first operational mode and said second operational mode responsive to said set of data.

10. The electric charging system of claim 1 wherein said station control, responsive to said set of data, detects a change to said charge target and establishes a second charging profile after an initiation of energy transfer to the energy storage system responsive to said first charging profile wherein said station control dynamically alters energy transfer to implement said second charging profile to meet said change to said charge target.

11. The electric charging system of claim 1 further comprising a communications network communicating a plurality of data of the energy storage system and said charging station to said station control.

12. The electric charging system of claim 11 wherein said communications network includes both wired and wireless communications paths.

13. The electric charging system of claim 12 further comprising a user interface communicated to said station control using said communications network, said user interface accepting user data from which said station control automatically establishes said charge target.

14. The electric charging system of claim 13 wherein the energy storage system includes a battery pack providing propulsion energy to an electric vehicle and wherein said electric vehicle provides data from which said station control automatically establishes said charge target.

15. The electric charging system of claim 14 further comprising a vehicle enhancement system that improves a charging-related parameter of the energy storage system when implemented, said vehicle enhancement system incompatible with providing a desired SOC level for the energy storage system in a shortest period, wherein said station control inhibits an actuation of said vehicle enhancement system in said first operational mode and enables said actuation of said vehicle enhancement system in said second operational mode.

16. The electric charging system of claim 15 wherein said vehicle enhancement system includes a heater, said charging-related parameter includes battery life, and said actuation pre-heats the energy storage system to a desired temperature before initiation of energy transfer at said slower charge rate.

17. The electric charging system of claim 16 where said one or more charge optimization parameters include one or more secondary considerations, said one or more secondary considerations including optimized economical charging of the energy storage system and optimized battery life for the energy storage system.

18. The electric charging system of claim 17 including a portable electronic device supporting operation of a charge control process, said portable electronic device in wireless communication with said station control to directly or indirectly set or alter one or more of said charge target.

19. The charging system of claim 18 wherein said electric vehicle includes a navigation system including a set of data identifying a future travel itinerary, said navigation system communicated to said station control using said communications network and wherein said station control is responsive to said future travel itinerary to automatically establish said charge target.

20. The electric charging system of claim 12 including a portable electronic device supporting operation of a charge control process, said portable electronic device in wireless communication with said station control to directly or indirectly set or alter one or more of said charge target.

21. The electric charging system of claim 11 further comprising a user interface communicated to said station control using said communications network, said user interface accepting user data explicitly identifying charge target.

22. The electric charging system of claim 11 wherein the energy storage system includes a battery pack providing propulsion energy to an electric vehicle and wherein said electric vehicle provides data from which said station control automatically establishes said charge target.

23. The electric charging system of claim 11 wherein the energy storage system includes a battery pack providing propulsion energy to an electric vehicle and wherein said electric vehicle provides data from which said station control automatically establishes said charge target, and wherein said electric vehicle includes a navigation system including a set of data identifying a future travel itinerary, said navigation system communicated to said station control using said communications network and wherein said station control is responsive to said future travel itinerary to automatically establish said charge target.

24. The electric charging system of claim 1 further comprising a vehicle enhancement system that improves a charging-related parameter of the energy storage system when implemented, said vehicle enhancement system incompatible with providing a desired SOC level for the energy storage system in a shortest period, wherein said station control inhibits an actuation of said vehicle enhancement system in said first operational mode and enables said actuation of said vehicle enhancement system in said second operational mode.

25. The electric charging system of claim 24 wherein said vehicle enhancement system includes a heater, said charging-related parameter includes battery life, and said actuation pre-heats the energy storage system to a desired temperature before initiation of energy transfer at said slower charge rate.

26. The electric charging system of claim 1 where said one or more charge optimization parameters include one or more secondary considerations, said one or more secondary considerations including optimized economical charging of the energy storage system and optimized battery life for the energy storage system.

* * * * *